United States Patent
Jouin et al.

(10) Patent No.: US 8,269,524 B2
(45) Date of Patent: Sep. 18, 2012

(54) GENERAL PURPOSE INPUT/OUTPUT PIN MAPPING

(75) Inventors: Sebastien Jouin, La Chapelle Launay (FR); Romain Oddoart, Petit Mars (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/768,120

(22) Filed: Apr. 27, 2010

(65) Prior Publication Data

US 2011/0260752 A1    Oct. 27, 2011

(51) Int. Cl.
    *H03K 19/173*      (2006.01)
(52) U.S. Cl. ................ 326/41; 326/39; 326/38
(58) Field of Classification Search .......... 326/38–47
    See application file for complete search history.

(56) References Cited

U.S. PATENT DOCUMENTS

| | | | | |
|---|---|---|---|---|
| 5,457,410 A | * | 10/1995 | Ting | 326/41 |
| 5,694,057 A | * | 12/1997 | Gould | 326/39 |
| 5,781,030 A | * | 7/1998 | Agrawal et al. | 326/39 |
| 6,057,706 A | * | 5/2000 | Barbier et al. | 326/39 |
| 6,580,288 B1 | * | 6/2003 | Klapproth | 326/38 |
| 6,625,793 B2 | * | 9/2003 | Sample et al. | 326/38 |
| 6,732,068 B2 | * | 5/2004 | Sample et al. | 703/24 |
| 7,482,836 B2 | * | 1/2009 | Levi et al. | 326/41 |

* cited by examiner

*Primary Examiner* — Shawki S Ismail
*Assistant Examiner* — Crystal L Hammond
(74) *Attorney, Agent, or Firm* — Fish & Richardson P.C.

(57) ABSTRACT

An I/O pin mapping module integrated on a microcontroller chip allows any microcontroller circuit node connected to the I/O pin mapping module to be mapped to any microcontroller I/O pin connected to the I/O pin mapping module. The size of the I/O pin mapping module can be customized prior to integration in accordance with the number of circuit nodes and I/O pins to be connected thereto. The I/O pin mapping module is programmable and can be described in a high level language to create a generic module that can be used in different microcontroller families, as well as in other types of integrated circuit chips.

22 Claims, 7 Drawing Sheets

GENERAL PURPOSE INPUT/OUTPUT PIN MAPPING

TECHNICAL FIELD

This specification relates generally to microcontrollers with configurable input/output (I/O) pins.

BACKGROUND

A microcontroller is an integrated circuit chip that can be used in a variety of different applications that include, for example, automobiles, medical devices, telephones, remote controls, and appliances. Microcontrollers have, among other things, logic circuits and I/O pins. The logic circuits may include specialized circuit modules that provide, for example, analog-to-digital conversion and/or logical interfacing (e.g., USART (universal synchronous/asynchronous receiver transmitter), TWI (two wire interface), and SPI (serial peripheral interface). The I/O pins connect logic circuits on the microcontroller to external devices and may be input only, output only, or bidirectional (i.e., both input and output). However, because the number of logic circuit inputs and outputs that can be connected to the I/O pins is usually greater than the number of I/O pins, and because different microcontroller applications may require connection to some logic circuits and not others, microcontrollers may have I/O pins that are software configurable. That is, users have some flexibility in selecting the logic circuit inputs and outputs to be connected to the I/O pins.

However, this flexibility is very limited in known microcontrollers because of fixed, predefined hardwired multiplexing between the microcontroller's logic circuits and I/O pins. For example, a microcontroller I/O pin may only be configurable with one of three possible functions. As shown in FIG. 1, PIN 1 is connected to multiplexer 102, which is hardwired to receive only FUNCTION 1, FUNCTION 2, and FUNCTION 3 from the microcontroller's logic circuits. Multiplexer 102 is controlled by software 104, which is programmable by a user. The user is limited to configuring microcontroller I/O PIN 1 to output only one of the three functions. Furthermore, FUNCTION 1, FUNCTION 2, and FUNCTION 3 may not be available at any other I/O pin. Thus, if more than one of those functions is desired in a user application, the user has to determine whether or not that application can do without any of the desired functions, and if not, the user may have to consider using another microcontroller.

FIG. 2 shows a more detailed example of a limited pinout configuration in a microcontroller. Microcontroller 200 includes circuit modules for a USART 204, a TWI 206, an SPI 208, and a timer 210. These modules each have outputs hardwired to one or more predefined multiplexers 202, which are connected to respective I/O pins of the microcontroller. Also hardwired to multiplexers 202 are outputs from high speed logic circuit 212 (which may perform, for example, DDR (double data rate) or Ethernet signaling functions). Because of the hardwired multiplexing, PIN 1, for example, can only be used to output either a USART.TX transmit signal, a TWI.SDA (two wire interface) serial data line, an SPI.CK (serial peripheral interface) clock, or a high speed or timing constrained signal from circuit 212. No other signals can be output from PIN 1 and three of those four signals can only be output at PIN 1.

FIGS. 3 and 4 illustrate the difficulties encountered early in the application development process by users of microcontrollers having limited pinout configurations. FIG. 3 represents a microcontroller 300 having four modules ("Mx", with x=1, 2, 3, or 4), each having three input/output signal nodes ("Ny", with y=1, 2, or 3). As shown, only three nodes representing functions A, B, and C, respectively, are available for mapping (i.e., connection) to any one I/O pin. That is, PIN 1 can only be configured to connect to node 1 of module 1 (M1_N1), node 1 of module 2 (M2_N1), or node 1 of module 3 (M3_N1). PIN 2 can only be configured to connect to node 1 of module 4 or node 2 of module 1 or 2. PIN 3 can only be configured to connect to node 2 of module 3 or 4 or node 3 of module 1. And PIN 4 can only be configured to connect to node 3 of module 2, 3, or 4. This limited pinout configuration is fixed at the integrated circuit (IC) design stage of the microcontroller, where IC designers have the difficult task of anticipating in advance all possible uses of the microcontroller in order to optimize the A/B/C allocations on each I/O pin.

Users need to study the available pinout configurations carefully in order to determine which logic circuit nodes to bring out to an I/O pin (and which ones to sacrifice) in accordance with the user's application. This can be done by referencing an I/O multiplexing map document or product datasheet, either manually or via software, wherein a look-up is performed for each pin to find the A/B/C/function allocation. In a worst case scenario, the available pinout configuration will not satisfy a user's requirements. Users of such known microcontrollers, therefore, need to consider such constraints early in the application development process.

FIG. 4 illustrates a process 400 of configuring the I/O pins of microcontroller 300. At step 401, a user identifies PIN 1 as being configurable to connect to only logic circuit node M1_N1, M2_N1, or M3_N1, representing functions A, B, and C, respectively. At step 403, the user programs software 304 to configure PIN 1 with selected function A. Multiplexer logic 302, which is controlled by software 304, connects node 1 of module 1 to PIN 1. Similarly, at step 405, the user identifies PIN 2 as being configurable to connect to only node M4_N1, M1_N2, or M2_N2. At step 407, the user programs software 304 to configure PIN 2 with selected function B, which connects node 2 of module 1 to PIN 2. And again, at step 409, the user identifies PIN 3 as being configurable to connect to only node M3_N2, M4_N2, or M1_N3. At step 411, the user programs software 304 to configure PIN 3 with selected function C. The complexity of this tedious process can increase dramatically as the number of I/O pins increases.

Microcontrollers are typically mounted on an application board which routes the connections from the microcontroller I/O pins to other devices. Another disadvantage of the limited pinout configurations of known microcontrollers is that optimizing the signal routing on an application board (which typically lowers the costs involved) may be very difficult. For example, signal routing on an application board may be optimized for a particular signal if that signal were mapped to PIN 50 because of that pin's location on the microcontroller chip; however, a user may only be able to use PIN 1 for that signal because of the microcontroller's limited pinout configuration, which will likely result in a less than optimized routing.

SUMMARY

An I/O pin mapping module integrated on a microcontroller chip is connected to microcontroller logic circuit nodes and microcontroller I/O pins. A user of the microcontroller can use the module to connect any one of those logic circuit nodes to any one of those I/O pins. Users are not limited by fixed hardwired I/O pin multiplexing typical of known microcontrollers. That is, I/O pins are not limited to only one of three or four possible circuit node connections and, accordingly, users no longer need to identify for each I/O pin a limited set of specific circuit nodes available thereat. A user can also optimize the routing of an application board upon which the microcontroller is mounted without being constrained by a limited pinout configuration.

The size of the I/O pin mapping module can be customized prior to integration. This allows the chip area required for the module on the microcontroller to be optimized for intended applications. Static parameters used with circuit implementation tools define the desired circuit nodes and I/O pins to be connected to the I/O pin mapping module. This feature also allows IC designers to imbed more logic circuits in low pinout microcontrollers, while still offering users a satisfactory number of circuit nodes connectable to I/O pins.

Interconnections within the I/O pin mapping module are programmable by a user. Dynamic parameters set by the user define the desired connections between the logic circuit nodes and the I/O pins. The dynamic parameters may also be used, for example, to configure pin time sharing on an I/O pin and/or to enable and disable receipt of signals from individual logic circuit nodes and/or individual I/O pins.

The I/O pin mapping module can be described in a high level language, which can create a generic module that can be used in different microcontroller families, as well as in other types of integrated circuit chips.

BRIEF DESCRIPTION OF THE DRAWINGS

The features and advantages of the disclosed subject matter will be apparent upon consideration of the following detailed description, taken in conjunction with the accompanying drawings, in which like reference characters refer to like parts throughout, and in which.

DETAILED DESCRIPTION

Figure 5:
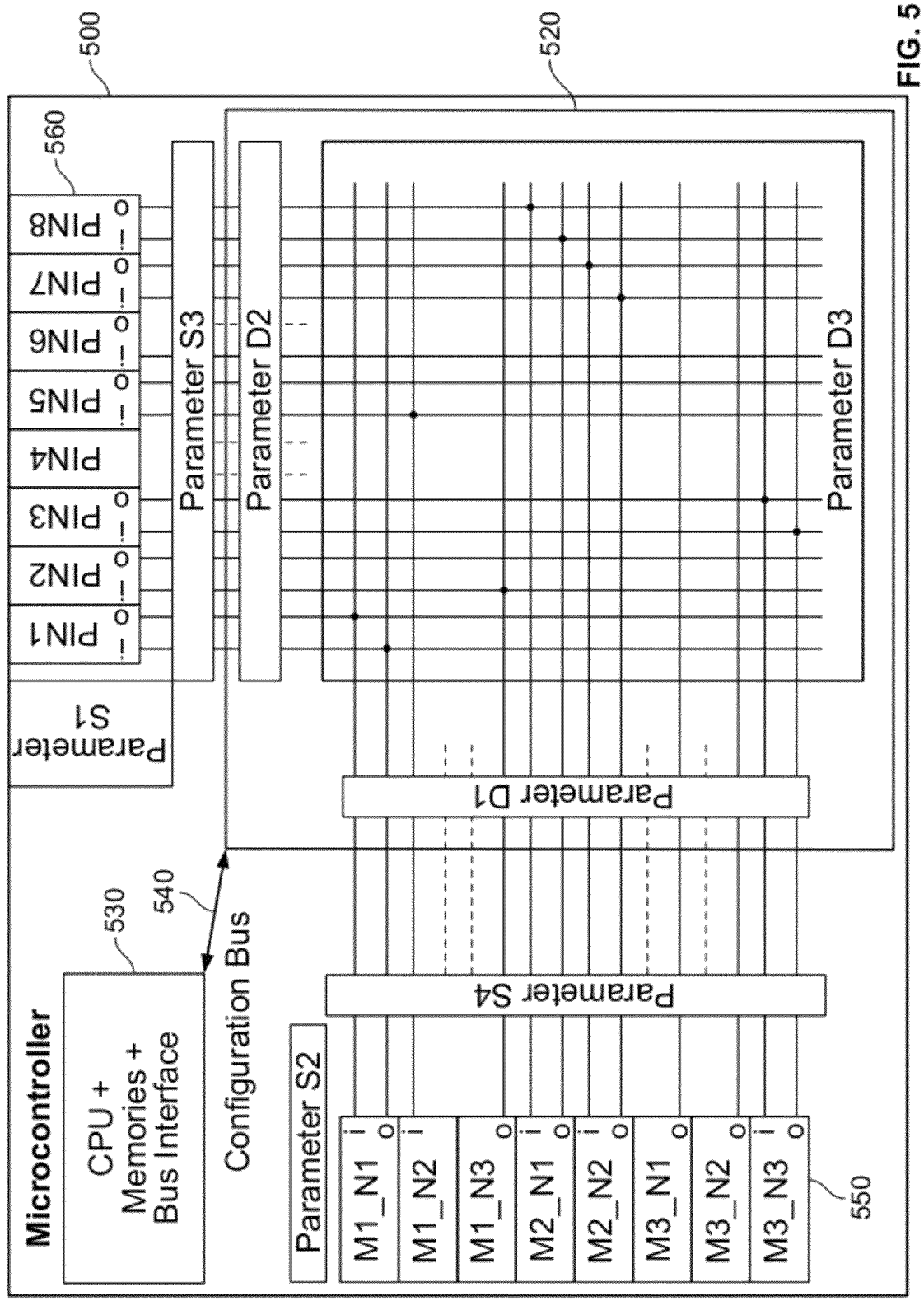
FIG. 5 illustrates the architecture of a microcontroller having an I/O pin mapping module integrated thereon.

FIG. 5 shows a microcontroller 500 having an I/O pin mapping module 520 integrated thereon. Microcontroller 500 includes a central processing unit (CPU), one or more memory modules, and a bus interface, all represented by block 530. A configuration bus 540 connects block 530 to I/O pin mapping module 520. The microcontroller also includes logic circuits/circuit modules 550 having input/output signal nodes M1_N1 to M3_N3. Microcontroller 500 further includes I/O pins 560, which include PIN 1 to PIN 8.

Prior to the silicon implementation of a microcontroller, the configuration (and size) of the I/O pin mapping module can be optimized using a number of static parameters. These static parameters are set prior to manufacture of the microcontroller chip and can be used by commercial software tools that build circuit logic and map that logic to a particular circuit technology, such as, for example, a CMOS (complementary metal-oxide-semiconductor) technology. Note that the static parameters can vary from one microcontroller family to another and can vary within the same microcontroller family depending on the intended uses of the microcontroller and any customized applications thereof.

In this embodiment, static parameters S1, S2, S3, and S4 are used to configure I/O pin mapping module 520. Static parameter S1 defines the microcontroller pins to be connected to the I/O pin mapping module. In this case, pins 1-3 and 5-8 are connected to module 520. Static parameter S2 defines the logic circuit/module nodes to be connected to the I/O pin mapping module. Static parameter S3 defines the type of I/O function (input, output, or bidirectional) to be performed by each microcontroller I/O pin. For example, PIN 6 has been designated as an input only I/O pin. And static parameter S4 defines the type of I/O function (input, output, or bidirectional) to be performed by the logic circuit/module nodes. For example, node M3_N2 is designated as an output only signal node. The static parameters play an important role in determining the size of the I/O pin mapping module and ultimately, but to a much lesser degree, the size (i.e., footprint) of the microcontroller chip. The larger the numbers of circuit/module nodes and I/O pins connected to the I/O pin mapping module, the larger the I/O pin mapping module and perhaps the microcontroller. Additionally, the type of node and I/O pin also affects the amount of silicon area required on the chip, because a bidirectional node or I/O pin requires more circuitry, and thus more silicon area, than an input only or output only node or pin. Accordingly, if more nodes and I/O pins are designated as bidirectional, the I/O pin mapping module would likely increase and possibly the footprint of the microcontroller chip as well. For example, a fully configurable I/O pin mapping module (comprising every signal I/O pin and at least the same number of circuit nodes) may increase the mapping module area by about 30% to 40% and the microcontroller chip footprint by about 1% to 2% when compared to hardwired I/O pin multiplexing typical of known microcontrollers.

Once implemented in silicon, I/O pin mapping module 520 can be programmed by a user to connect particular circuit nodes M1_N1 to M3_N3 to particular I/O pins 560. Any circuit node connected to the I/O pin mapping module can be connected to any I/O pin connected to the I/O pin mapping module. A set of dynamic parameters is used in conjunction with software to connect within I/O pin mapping module 520 selected circuit nodes to selected I/O pins. In this embodiment, dynamic parameters D1, D2, and D3 are used. Dynamic parameter D1 enables/disables individual circuit nodes. When disabled, the signal activity at a circuit node is not propagated through the I/O pin mapping module, which can reduce power consumption. Dynamic parameter D2 enables/disables individual microcontroller I/O pins. When disabled, the signal activity of an I/O pin is also not propagated through the I/O pin mapping module which, again, can reduce power consumption. Dynamic parameter D3 defines for each microcontroller I/O pin the circuit node to be connected thereto. This parameter can also define pin time sharing, which is useful in low pin count microcontrollers. For example, several external devices using different logical interfaces (such as, for example, USART, TWI, and SPI) can be connected to a common set of microcontroller I/O pins. Software is then able to exchange data with each of these devices during separate time slots. The dynamic parameters are accessible by software resident on at least one memory module 530 and executed by CPU 530. In some embodiments, certain CPU instructions read and write the contents of the dynamic parameters through the bus interface. A user interface to the software, allowing a user to program the dynamic parameters, may be implemented through a graphical user interface (GUI). The dynamic parameters allow the user to optimize the power consumed by the I/O pin mapping module and to optimize the number of application board routing layers on which the microcontroller is embedded.

The I/O pin mapping module can be described in a high level language (e.g., RTL (register transfer level) languages including Verilog, VHDL, SystemVerilog, and SystemC). This allows the I/O pin mapping module to be a generic module that can be used in different microcontroller families (including high and low pin count microcontrollers) and in other suitable types of integrated circuit chips, such as, for example, application-specific integrated circuits, programmable logic devices, and field-programmable gate arrays.

Figure 6:
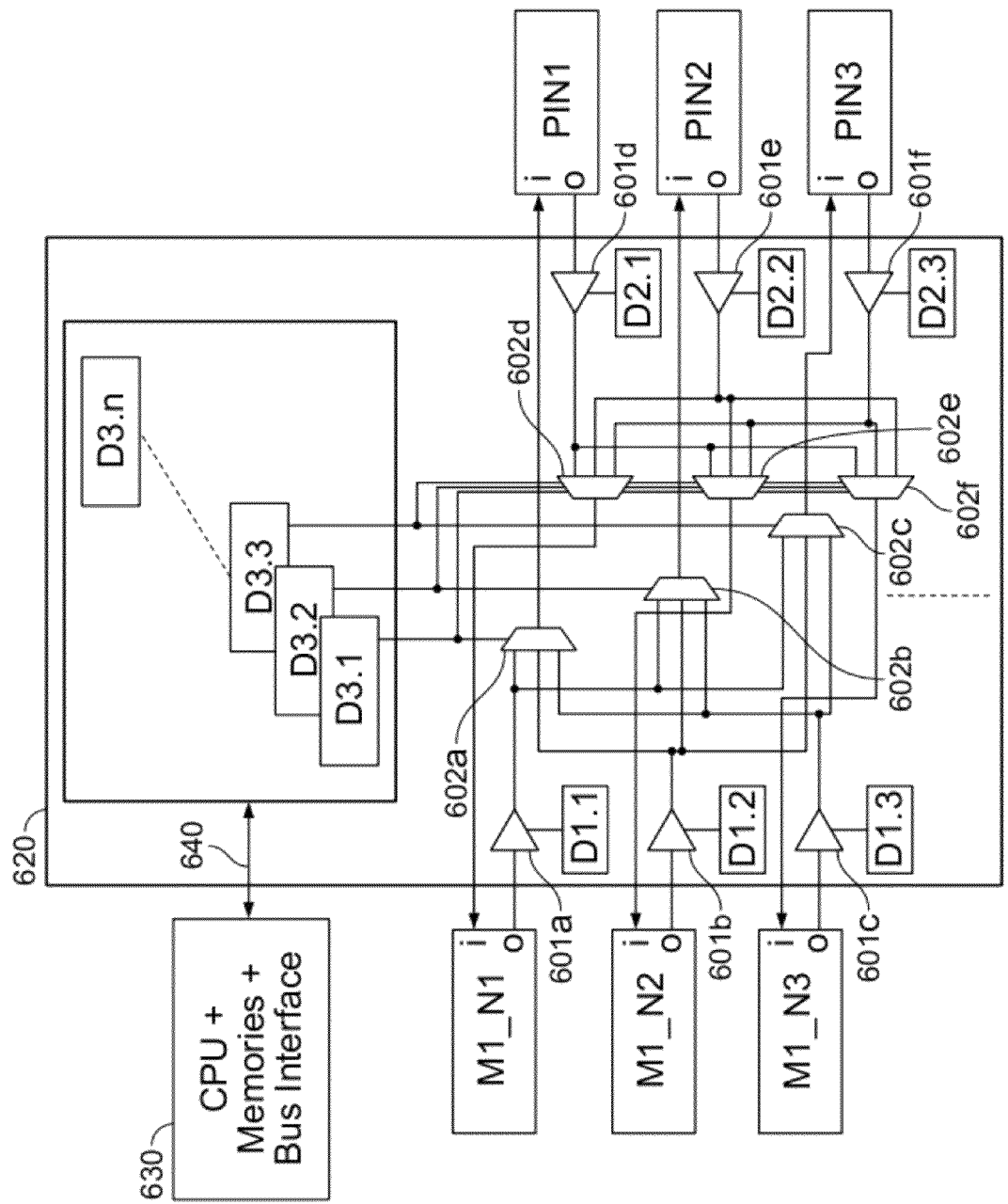
FIG. 6 illustrates a representative portion of an embodiment of circuitry of an I/O pin mapping module.

FIG. 6 shows a representative portion of an embodiment of circuitry of an I/O pin mapping module 620. I/O pin mapping module 620 is connected via a configuration bus 640 to block 630, which represents the CPU, memory, and bus interface of a microcontroller on which module 620 is integrated. Logic circuit/module nodes M1_N1, M1_N2, and M1_N3 are connected to module 620, as are I/O PIN 1, I/O PIN 2, and I/O PIN 3. I/O pin mapping module 620 includes a plurality of dynamic parameters D1.$x$, D2.$x$, and D3.$y$ (where $x$=1, 2, or 3 and $y$=1 to n). These dynamic parameters, which perform at least the same functions as D1, D2, and D3 of FIG. 5, are directly connected to logic circuits of module 620. Dynamic parameters D1.$x$ are respectively connected to logic AND gates 601$a,b,c$, where they enable or disable the signal received from the respective circuit node. Dynamic parameters D2.$x$ are respectively connected to AND gates 601$d,e,f$, where they enable or disable the signal received from the respective I/O pin. Dynamic parameters D3.$y$ are connected to multiplexers 602$a,b,c,d,e,f$ as shown, where they determine which of the circuit nodes is connected to which of the I/O pins. Note that each multiplexer 602$a,b,c$ receives an input from each circuit node, and that each multiplexer 602$d,e,f$ receives an input from each I/O pin. This allows any one of the circuit nodes to be connected to any one of the I/O pins, including signals to be output from the nodes and signals to be input from the I/O pins. The circuitry shown can be replicated and/or expanded as needed to include any number of circuit nodes and I/O pins (up to, of course, the maximum number of signal I/O pins on the microcontroller chip) subject to the chip area available to the I/O pin mapping module and/or the maximum allowable size of the microcontroller footprint.

Figure 1:
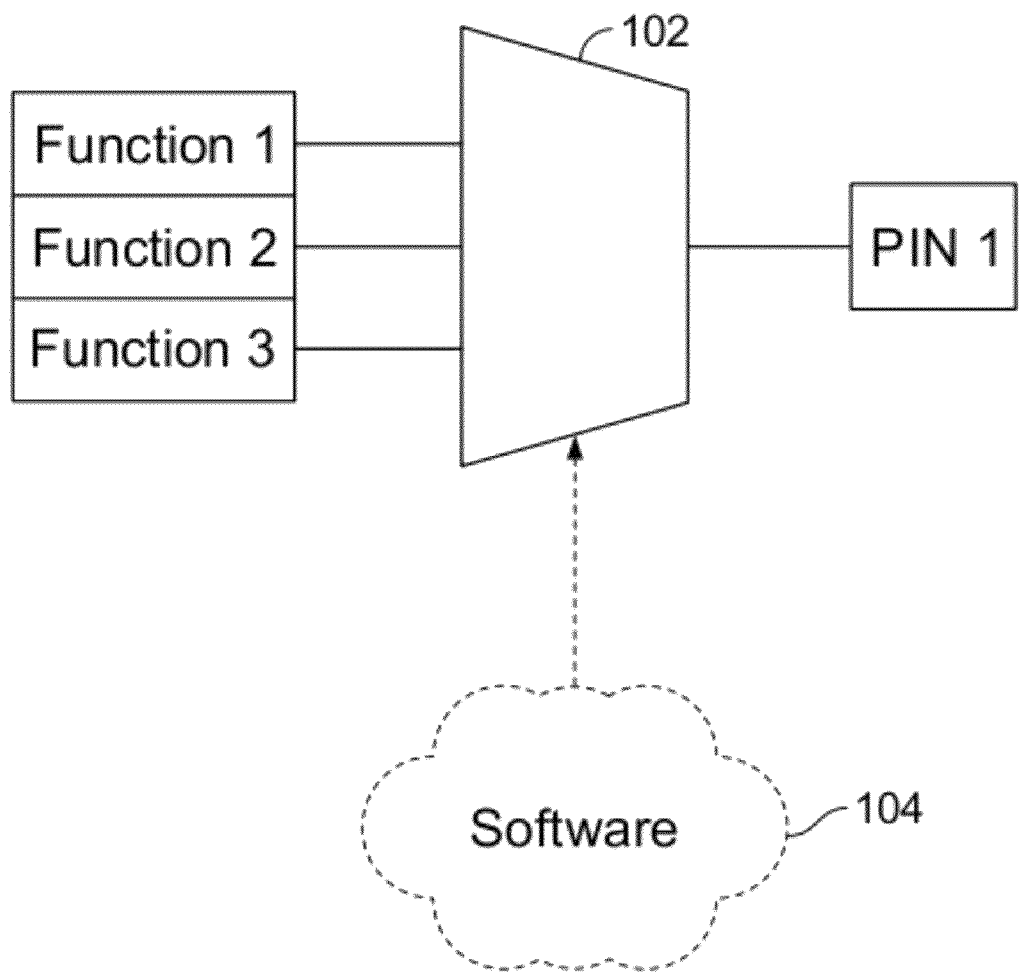
FIG. 1 illustrates a simple example of predefined hardwired multiplexing of a configurable microcontroller I/O pin.
Figure 2:
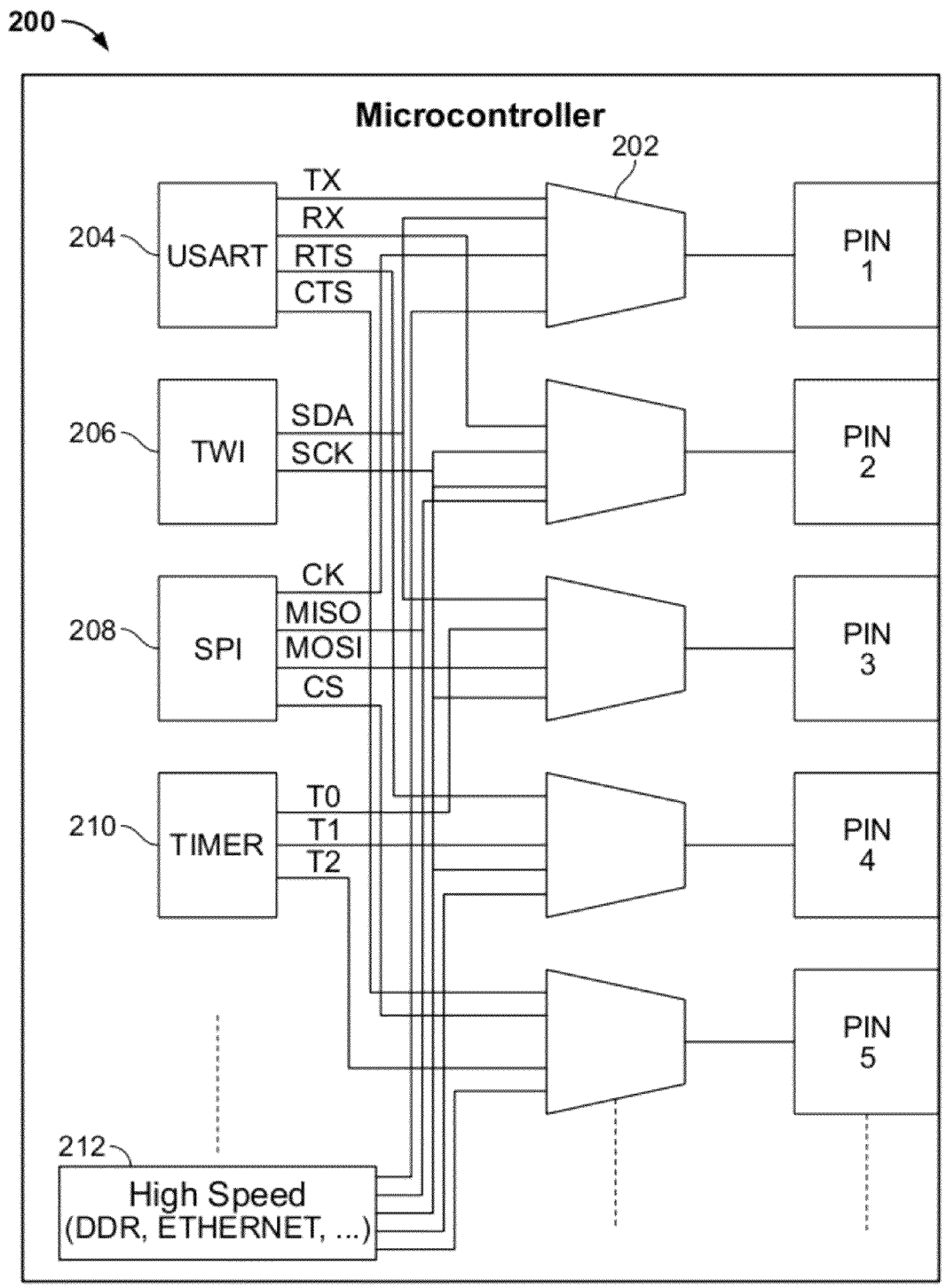
FIG. 2 illustrates an example of a limited pinout configuration in a microcontroller.
Figure 7:
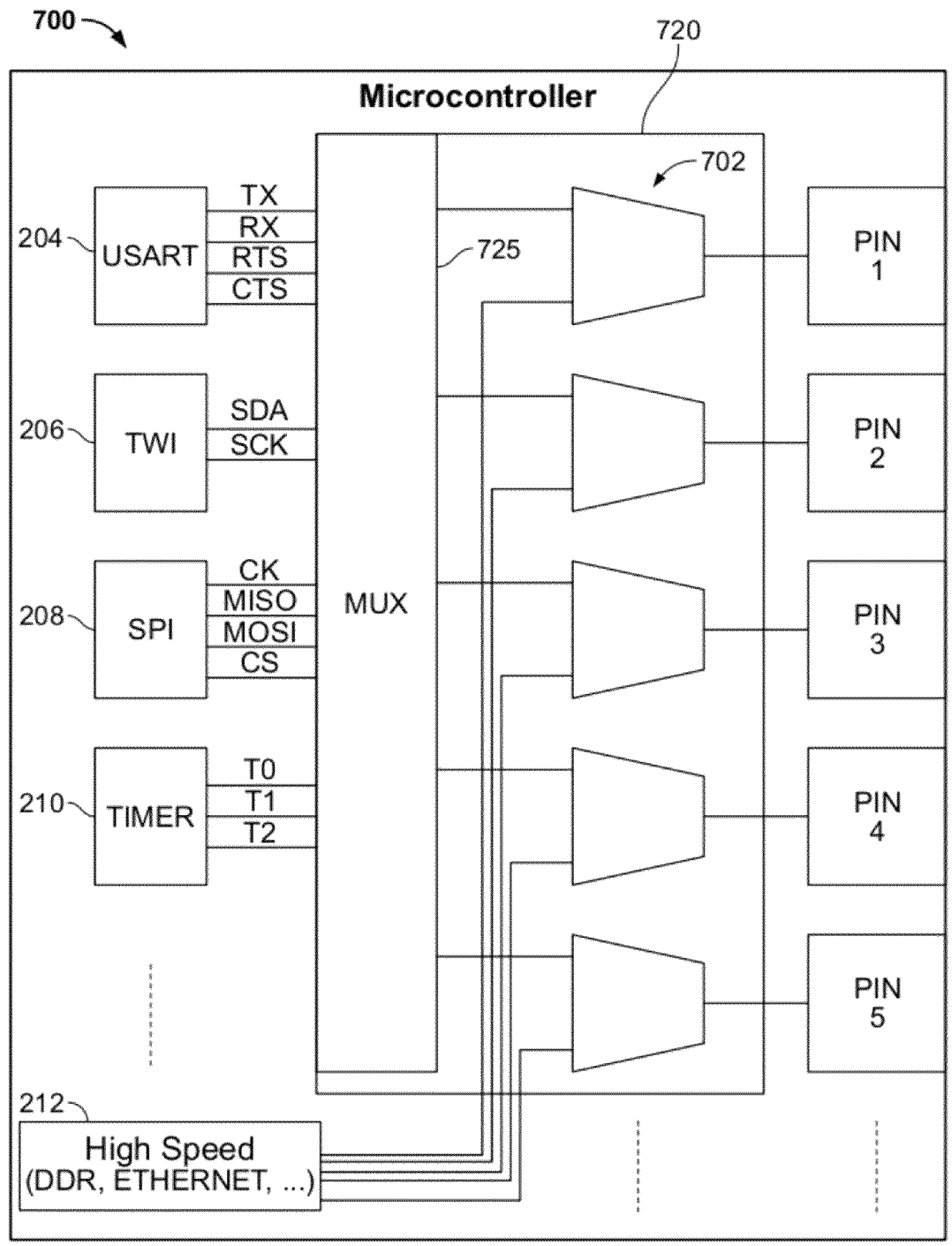
FIG. 7 illustrates another embodiment of a microcontroller having an I/O pin mapping module integrated thereon.

FIG. 7 shows another embodiment of an I/O pin mapping module integrated on a microcontroller. In particular, microcontroller 700 includes I/O pin mapping module 720, which can replace the limited pinout configuration of microcontroller 200 of FIG. 2. In this embodiment, I/O pin mapping module 720 includes a fully configurable multiplexer 725 connected to a single level of hardwired multiplexing 702. Hardwired multiplexing 702 is controlled by software programmable by a user and receives inputs from high speed logic circuit 212. Similar to microcontroller 200, microcontroller 700 also includes circuit modules for a USART 204, a TWI 206, an SPI 208, and a timer 210. However, unlike microcontroller 200, the outputs from those circuit modules are not limited to any one I/O pin. Thus, while certain high speed or timing constrained signals from logic circuit 212 may be programmed through hardwired multiplexing 702 to one or more I/O pins as required by a user's application, any remaining I/O pins can be configured by the user to receive any of the signals from the modules connected to multiplexer 725, which are typically low speed or not timing constrained. This embodiment combines the techniques of fixed hardwired I/O multiplexing for high speed or timing-constrained signals with the high flexibility I/O multiplexing for low speed or non-timing constrained signals. The routability of an application board embedding microcontroller 700 can still, therefore, be optimized, which will often result in a cost savings.

Figure 8:
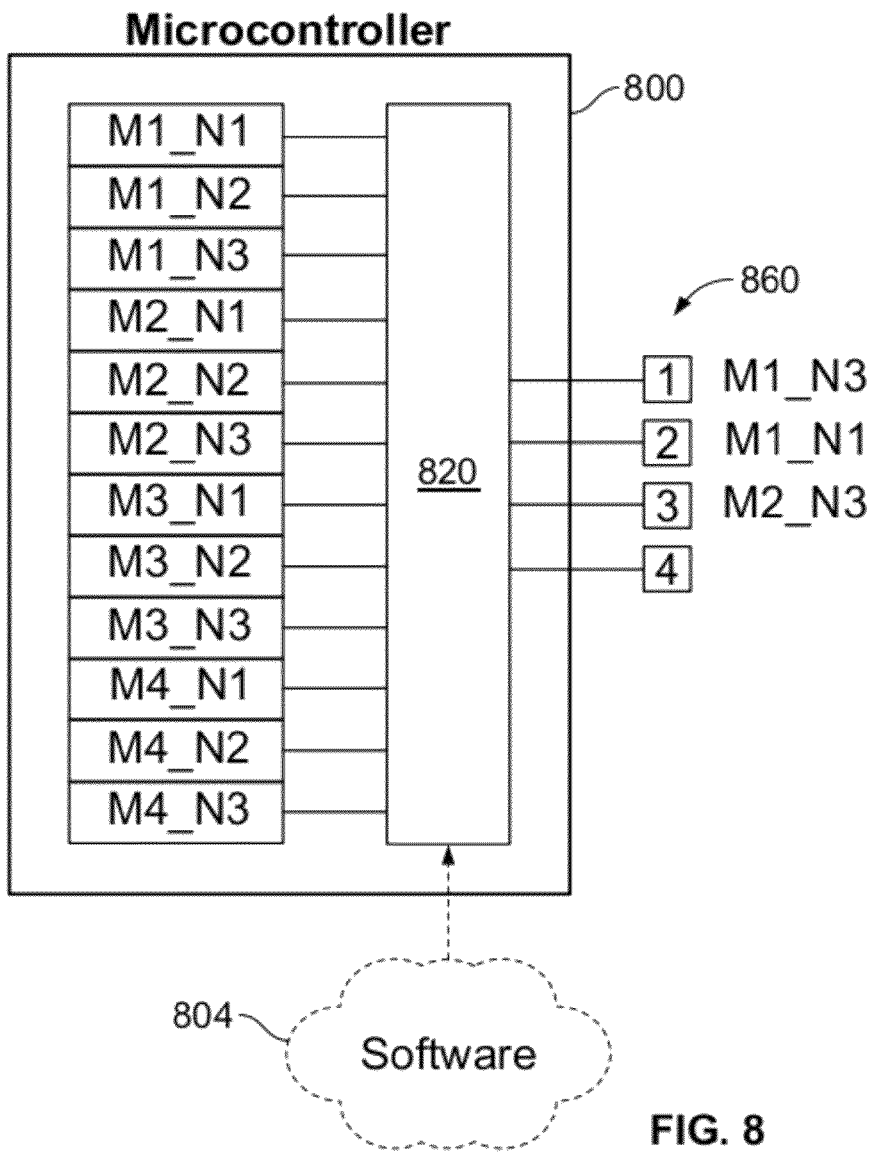
FIG. 8 illustrates another embodiment of a microcontroller having an I/O pin mapping module integrated thereon.
Figure 9:
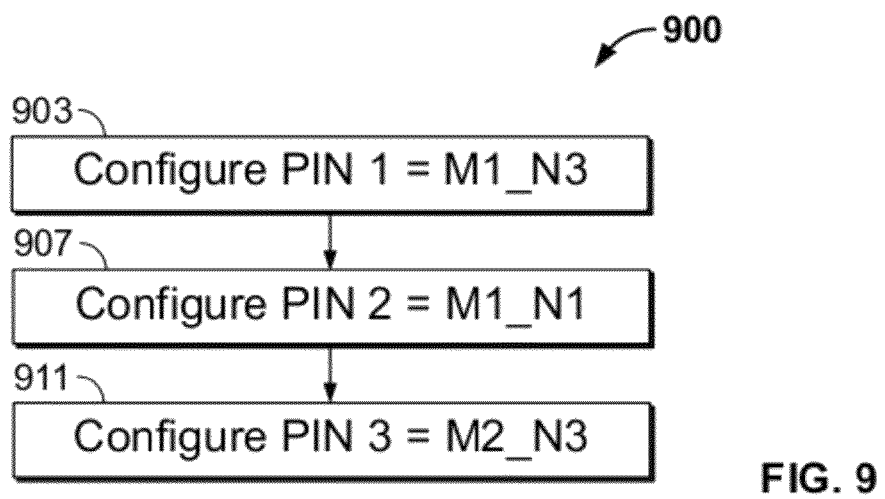
FIG. 9 is a flowchart illustrating a process of configuring the I/O pins of the microcontroller of FIG. 8.

FIGS. 8 and 9 illustrate an improved process of configuring I/O pins with an I/O pin mapping module. FIG. 8 shows a microcontroller 800 having an I/O pin mapping module 820, four I/O pins 860, software 804, and four modules ("Mx", with $x$=1, 2, 3, or 4), each having three input/output circuit nodes ("Ny", with $y$=1, 2, or 3). I/O pin mapping module 820 can be programmed by a user to map any one of the 12 module circuit nodes to any one of the four I/O pins. As shown, a user has connected node M1_N3 to PIN 1, node M1_N1 to PIN 2, and node M2_N3 to PIN 3. In this embodiment, PIN 4 is left unconnected.

FIG. 9 illustrates a streamlined process 900 of configuring the I/O pins of microcontroller 800. A user configures each I/O pin by using software 804 to set the dynamic parameters with the selected nodes and I/O pins. In step 903, a user sets a dynamic parameter with a node identifier or reference number indicating that node M1_N3 is to be connected to PIN 1. Similarly, in step 907, the user programs software 804 to configure PIN 2 with selected node M1_N1, and at step 911, the user programs software 804 to configure PIN 3 with selected node M2_N3. The user no longer needs to identify what nodes or functions are available at each individual I/O pin as with microcontrollers having limited pinout configurations.

Figure 3:
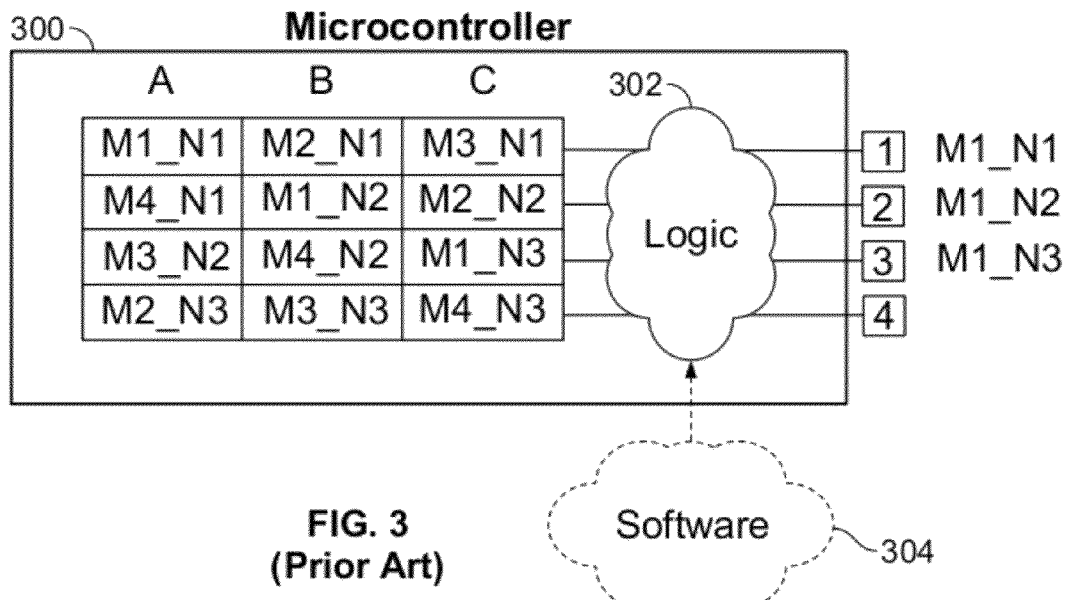
FIG. 3 illustrates another example of a limited pinout configuration in a microcontroller.
Figure 4:
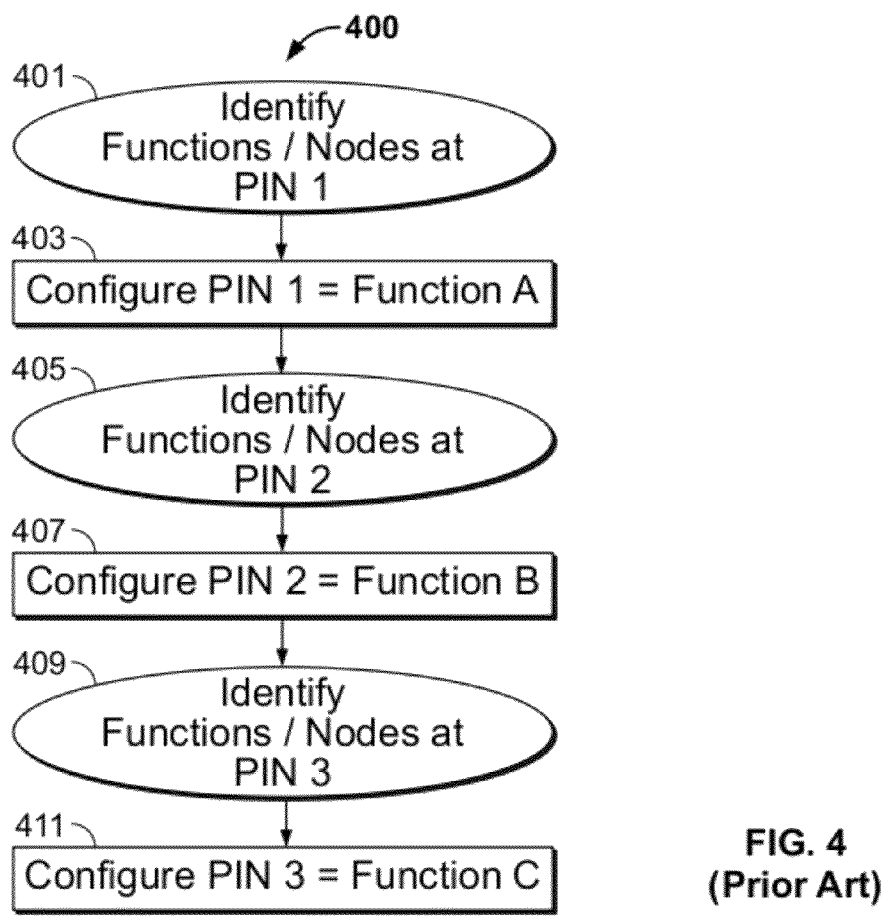
FIG. 4 is a flowchart illustrating a process of configuring the I/O pins of the microcontroller of FIG. 3.

Compare microcontroller 800 and streamlined process 900 with known microcontroller 300 and process 400 of FIGS. 3 and 4. Note first that the I/O pin configuration of microcontroller 800 is not possible in microcontroller 300, because the selected nodes are not available at the same pins of microcontroller 300. Note also that I/O pin mapping module 820 dramatically simplifies the configuration process, allowing users to easily configure microcontroller I/O pins without having to analyze individual I/O pin configurations. Furthermore, because many more I/O pin configurations are possible, microcontroller 800 can be used in potentially many more applications than microcontroller 300. For example, the I/O pin mapping module can duplicate I/O pin configurations. That is, multiple pins (e.g., both PIN 3 and PIN 4 in microcontroller 800) can be configured with the same logic circuit/module node. This may be useful in applications where, for example, parallel pins are needed to drive a signal that requires the microcontroller to have improved drive/sink current capability. Microcontrollers having the I/O pin mapping module plainly have improved configurability and versatility when compared with microcontrollers employing known pinout configuration techniques.

The I/O pin mapping module has been described in connection with the preferred embodiments. These embodiments, however, are merely examples. Those skilled in the art understand that other variations and modifications can be easily made within the scope of the invention.

We claim:

1. An input/output pin mapping module comprising:
 a plurality of multiplexers, each multiplexer having a first input configured to connect to a high speed logic circuit;
 configurable circuitry connectable to a plurality of circuit nodes and to a plurality of integrated circuit chip input/output pins, the configurable circuitry operative to connect selected circuit nodes to selected input/output pins, each input/output pin being connected to the configurable circuitry by a second input of a respective multiplexer of the plurality of multiplexers; and
a plurality of parameters defining which ones of the circuit nodes are to be connected within the configurable circuitry to which ones of the input/output pins; wherein:
any circuit node connected to the configurable circuitry is connectable to any input/output pin connected to the configurable circuitry.

2. The input/output pin mapping module of claim 1 further comprising a bus connected to the configurable circuitry and connectable to a central processing unit, a memory, or both.

3. The input/output pin mapping module of claim 1, wherein the configurable circuitry comprises a plurality of multiplexers connectable to the circuit nodes or to the input/output pins, the multiplexers controlled by the plurality of parameters.

4. The input/output pin mapping module of claim 1, wherein the configurable circuitry is programmable by a user via the parameters.

5. The input/output pin mapping module of claim 1, wherein one of the plurality of circuit nodes is an input or output node from a universal synchronous/asynchronous receiver transmitter module.

6. The input/output pin mapping module of claim 1, wherein the plurality of parameters define the input/output pins to be input only, output only, pin time shared, or bidirectional.

7. The input/output pin mapping module of claim 1 further comprising a second plurality of parameters that enable or disable receipt of signals from individual circuit nodes.

8. The input/output pin mapping module of claim 1 further comprising a third plurality of parameters that enable or disable individual input/output pins.

9. The input/output pin mapping module of claim 1, the plurality of parameters further defining, for at least a first input/output pin, a plurality of separate time slots for pin time sharing on the first input/output pin, each time slot being defined for a different external device to exchange data on the first input/output pin during the time slot.

10. A microcontroller comprising:
a central processing unit;
a memory module;
a bus connecting the central processing unit and the memory module;
a plurality of logic circuits or circuit modules interconnected with the central processing unit or the bus and each having one or more circuit nodes;
a high speed logic circuit;
a plurality of input/output pins;
an input/output pin mapping module connected to the bus, to a plurality of the circuit nodes, and to at least some of the plurality of input/output pins, the input/output mapping module including configurable circuitry programmable to connect any one of the plurality of circuit nodes to any one of the at least some input/output pins, the input/output pin mapping module including a plurality of multiplexers, each multiplexer having a first input connected to the high speed logic circuit, each input/output pin being connected to the configurable circuitry by a second input of a respective multiplexer of the plurality of multiplexers; and
a plurality of dynamic programmable parameters, some of which indicate which ones the circuit nodes are to be connected to which ones of the pins within the input/output mapping module.

11. The microcontroller of claim 10, wherein software for programming the input/output mapping module resides in the memory module.

12. The microcontroller of claim 10 further comprising a plurality of static programmable parameters that identify which of the circuit nodes and which of the input/output pins are to be connected to the input/output mapping module.

13. The microcontroller of claim 10, wherein some of the plurality of dynamic parameters enable or disable receipt of signals within the input/output mapping module from individual circuit nodes.

14. The microcontroller of claim 10, wherein some of the plurality of dynamic parameters enable or disable receipt of signals within the input/output mapping module from individual input/output pins.

15. The microcontroller of claim 10, wherein the high speed logic circuit is subject to one or more timing constraints and the plurality of logic circuits are not subject to the timing constraints.

16. The microcontroller of claim 10, the plurality of parameters further defining, for at least a first input/output pin, a plurality of separate time slots for pin time sharing on the first input/output pin, each time slot being defined for a different external device to exchange data on the first input/output pin during the time slot.

17. An integrated circuit chip comprising:
a plurality of logic circuits or circuit modules each having one or more circuit nodes;
a plurality of input/output pins;
a high speed logic circuit, wherein the high speed logic circuit is subject to one or more timing constraints and the plurality of logic circuits are not subject to the timing constraints; and
an input/output pin mapping module connected to a plurality of the circuit nodes and to at least some of the plurality of input/output pins, the input/output mapping module including configurable circuitry operative to connect any one of the plurality of circuit nodes to any one of the at least some input/output pins, the input/output mapping module including a plurality of multiplexers, each multiplexer having a first input connected to the high speed logic circuit, each input/output pin being connected to the configurable circuitry by a second input of a respective multiplexer of the plurality of multiplexers,
the input/output pin mapping module comprising a plurality of dynamic programmable parameters configured to define the connection of anyone of the plurality of circuit nodes to anyone of the at least some input/output pins.

18. The integrated circuit chip of claim 17, wherein the plurality of input/output pins is connected to the input/output pin mapping module and an equal or greater number of circuit nodes is connected to the input/output pin mapping module, the input/output mapping module operative to connect anyone of the plurality of circuit nodes to anyone of the input/output pins.

19. The integrated circuit chip of claim 17 further comprising a memory connected to at least one of the logic circuits or circuit modules, wherein the input/output pin mapping module is programmable via software stored in the memory.

20. The integrated circuit chip of claim 17, wherein the input/output pin mapping module comprises a plurality of multiplexers connected to the plurality of circuit nodes or to the at least some input/output pins, the multiplexers controlled by a plurality of user defined parameters.

21. The integrated circuit chip of claim 17, wherein the plurality of logic circuits or circuit modules form an application-specific integrated circuit, a programmable logic device, or a field-programmable gate array.

22. The integrated circuit of claim 17, the dynamic programmable parameters also configured to define, for at least a first input/output pin, a plurality of separate time slots for pin time sharing on the first input/output pin, each time slot being defined for a different external device to exchange data on the first input/output pin during the time slot.

* * * * *